US006973008B2

(12) United States Patent
Krause

(10) Patent No.: US 6,973,008 B2
(45) Date of Patent: Dec. 6, 2005

(54) APPARATUS FOR FLEXIBLE DEACTIVATION OF WORD LINES OF DYNAMIC MEMORY MODULES AND METHOD THEREFOR

(75) Inventor: Gunnar H. Krause, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/834,416

(22) Filed: Apr. 29, 2004

(65) Prior Publication Data

US 2005/0002220 A1    Jan. 6, 2005

(30) Foreign Application Priority Data

Apr. 29, 2003    (DE) ................................ 103 19 158

(51) Int. Cl.[7] ................................................ G11C 8/00
(52) U.S. Cl. ...................................... 365/233; 365/191
(58) Field of Search ................................. 365/233, 191

(56) References Cited

U.S. PATENT DOCUMENTS

| | | | | |
|---|---|---|---|---|
| 6,052,331 A | * | 4/2000 | Araki et al. .................. | 365/233 |
| 6,130,843 A | * | 10/2000 | Lee .......................... | 365/189.05 |
| 6,327,192 B1 | * | 12/2001 | Lee .......................... | 365/189.05 |
| 6,459,641 B2 | * | 10/2002 | Fujioka et al. ............... | 365/220 |
| 6,504,780 B2 | * | 1/2003 | Leung ........................ | 365/222 |
| 6,510,070 B2 | * | 1/2003 | Tanaka et al. ................ | 365/49 |
| 6,608,772 B2 | * | 8/2003 | Ooishi ....................... | 365/63 |
| 6,898,140 B2 | * | 5/2005 | Leung et al. ................ | 365/222 |

FOREIGN PATENT DOCUMENTS

| | | |
|---|---|---|
| DE | 41 18 804 A1 | 2/1994 |
| DE | 197 82 017 T1 | 8/1999 |

OTHER PUBLICATIONS

German Examination Report dated Jan. 13, 2004.

* cited by examiner

*Primary Examiner*—Michael Tran
(74) *Attorney, Agent, or Firm*—Patterson & Sheridan, L.L.P.

(57) ABSTRACT

An apparatus and a method are proposed, which can be used to delay a deactivation of a row address in the event of repeated access to a bank of an RLDRAM memory module.

20 Claims, 3 Drawing Sheets

APPARATUS FOR FLEXIBLE DEACTIVATION OF WORD LINES OF DYNAMIC MEMORY MODULES AND METHOD THEREFOR

CROSS-REFERENCE TO RELATED APPLICATIONS

This application claims foreign priority benefits under 35 U.S.C. §119 to co-pending German patent application number 103 19 158.5-53, filed Apr. 29, 2003. This related patent application is herein incorporated by reference in its entirety.

BACKGROUND OF THE INVENTION

1. Field of the Invention

The invention relates to an apparatus for flexible deactivation of word lines of dynamic random access memory (DRAM) modules, in particular of Reduced Latency DRAM (RLDRAM) memory modules, and to a method therefor.

2. Description of the Related Art

A new type of memory module enabling accelerated accesses to memory cells of the memory module has recently become known in the field of dynamic memory modules. This is achieved in that the memory module has a non-multiplexed address/data bus which can be used to apply a row and column address of the memory cell essentially simultaneously to the memory module. The time that is required in conventional dynamic memory modules for multiplexed feeding of the word and bit line addresses is thereby reduced in an advantageous manner. The new type of dynamic memory module thus makes it possible to reduce a latency between an application of the complete address and a read-out of data, which is why the designation "reduced latency DRAM" is customary for the new type of memory module.

A mechanism of access to memory cells of the dynamic RLDRAM memory module is furthermore characterized by the fact that, between two accesses to one and the same bank, there must be a plurality of system clock cycles in which only other banks can be accessed. The system clock cycles may also have dummy cycles as an alternative. The order of accesses to the individual banks among one another is arbitrary. A waiting time thus disadvantageously results for the case where one and the same bank has to be accessed at least a second time in succession. This may result in access times to memory cells of the RLDRAM that are lengthened to a greater or less extent.

Accordingly, there is a need for a memory module and a method for activation and deactivation of memory cells of a memory module which can be used to achieve accelerated accesses to memory cells of dynamic RLDRAM memory modules.

SUMMARY OF THE INVENTION

In accordance with a first aspect of the present invention, it is possible, by means of an additional device in a dynamic RLDRAM memory module, to delay the deactivation of an activated row address of an activated bank for the case where, within a defined time duration, the already activated bank is accessed in renewed fashion, the row address of the new access being unchanged in comparison with the preceding access.

This advantageously enables accelerated access to memory cells with a constant row address of a bank of the dynamic memory module.

In accordance with a further aspect of the apparatus according to the invention, it is possible to effect as many renewed accesses as desired to the activated bank within the defined time duration, it being possible to delay the deactivation of the activated row address in each case by the defined time duration in the event of each further access to the bank.

As a result, it is expediently possible to keep an activation signal for the row address activated by multiple successive accesses to the same row address. As a result, it is possible to address successively different column addresses of the activated bank of the memory module with a constant row address. A volume of data to be transferred into or from the memory cells of the RLDRAM can thereby be increased to a considerable extent.

BRIEF DESCRIPTION OF THE DRAWINGS

In order to assist understanding of the invention.

DETAILED DESCRIPTION OF THE PREFERRED EMBODIMENT

Figure 1:
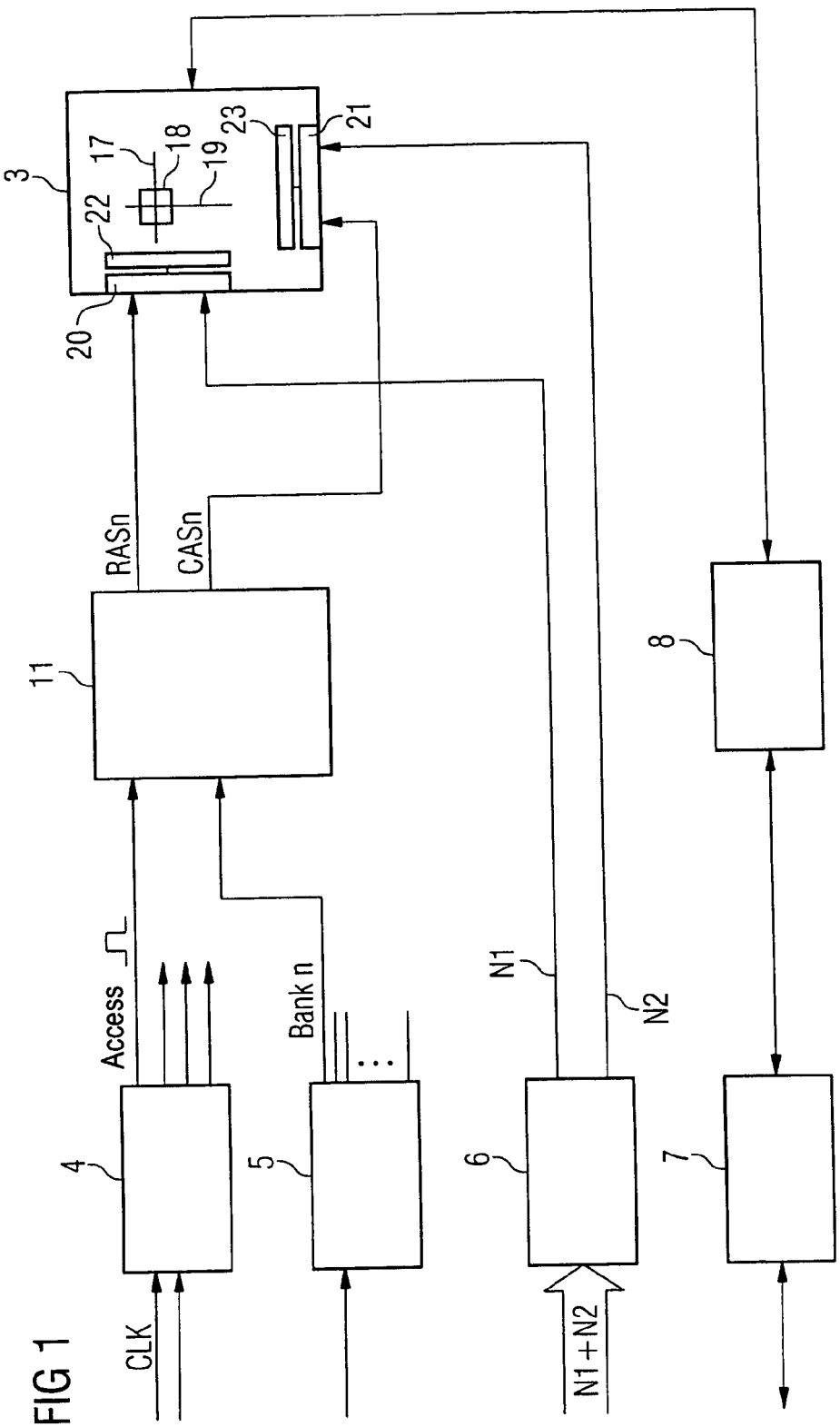
FIG. 1 shows a basic block diagram of a reduced latency dynamic random access memory (RLDRAM) module.

FIG. 1 shows a block diagram of a basic construction of a dynamic random access memory (DRAM) module of the reduced latency (RLDRAM) type. The memory module has a plurality of banks 3 (only a single bank 3 is illustrated in the figure), a respective activation device 11 being provided for activation of each of the banks 3, said activation device being connected to an assigned bank 3. Other devices within the dynamic RLDRAM memory module are responsible for all the banks 3 of the memory module, such as, for instance, a command decoder 4, a bank decoder 5, an addressing device 6, a data input/output device 7 and also a data path 8. Further devices within the RLDRAM which are not very important for understanding the present invention are not illustrated in FIG. 1.

In the event of an access to a memory cell 18 within the bank 3, a complete row/column address is applied to the addressing device 6 in a non-multiplexed manner, i.e. in one operation. In this case, the row and column address are fed in parallel in one operation. The addressing device 6 feeds the address to the bank 3 via an internal bus within the module. In this case, the bus may be arranged between the addressing device 6 and the bank 3 and have a first width N1 for transferring the row address. Said bus may have a second width N2, for example, for transferring the column address. N1 and N2 are integer values in this case. The row address is applied to a row address decoder 20 within the bank 3, which is connected to a row select circuit 22. Word lines 17 of the bank 3 are selected in this way.

The column addresses are fed to a column address decoder 21 within the bank 3, which is connected to a column select circuit 23. Bit lines 19 are thereby selected to within the bank 3. In the event of an access to a specific memory cell 18, a pulsed access signal is passed from an output of the command decoder 4 and a bank selection signal is passed from an output of the bank decoder 5 to the activation device 11. The activation device 11 thereupon outputs a first activation signal RASn for the row address and, in time-delayed fashion, a second activation signal CASn for the column address to the bank 3.

The selected word line 17 is thereby activated, i.e. put at a high level. The high level serves for driving selection transistors (not illustrated) of the memory cells 18, which are turned on by means of the selected word lines 17 and the bit lines 19 and thereby produce an electrically conductive connection between the memory cells 18 and the addressed bit lines 19. By means of the second activation signal CASn, the charge of an addressed storage capacitor (not illustrated) of the memory cell 18 is transferred onto the selected bit line 19 and further subsequently onto the data path 8. A datum which is read from the memory cell 18 or written to the memory cell 18 is transferred via the data path 8 between bank 3 and data input/output device 7 and output or read in by means of the data input/output device 7.

After the memory cell 18 has been accessed, the activation signal RASn for the row address continues to be activated for a certain time duration in accordance with a specified access mechanism. In the case of this access mechanism, in accordance with the prior art, in the case of further memory cell accesses, it is further subsequently provided that further banks 3 are addressed before an already addressed bank 3 of the memory module is accessed in renewed fashion. Consequently, this predetermined access mechanism in accordance with the prior art may result in a disadvantageous lengthening of access times to memory cells 18 of the dynamic memory module in particular for the case where the memory cells 18 are preferably arranged in one and the same banks 3.

Figure 2:
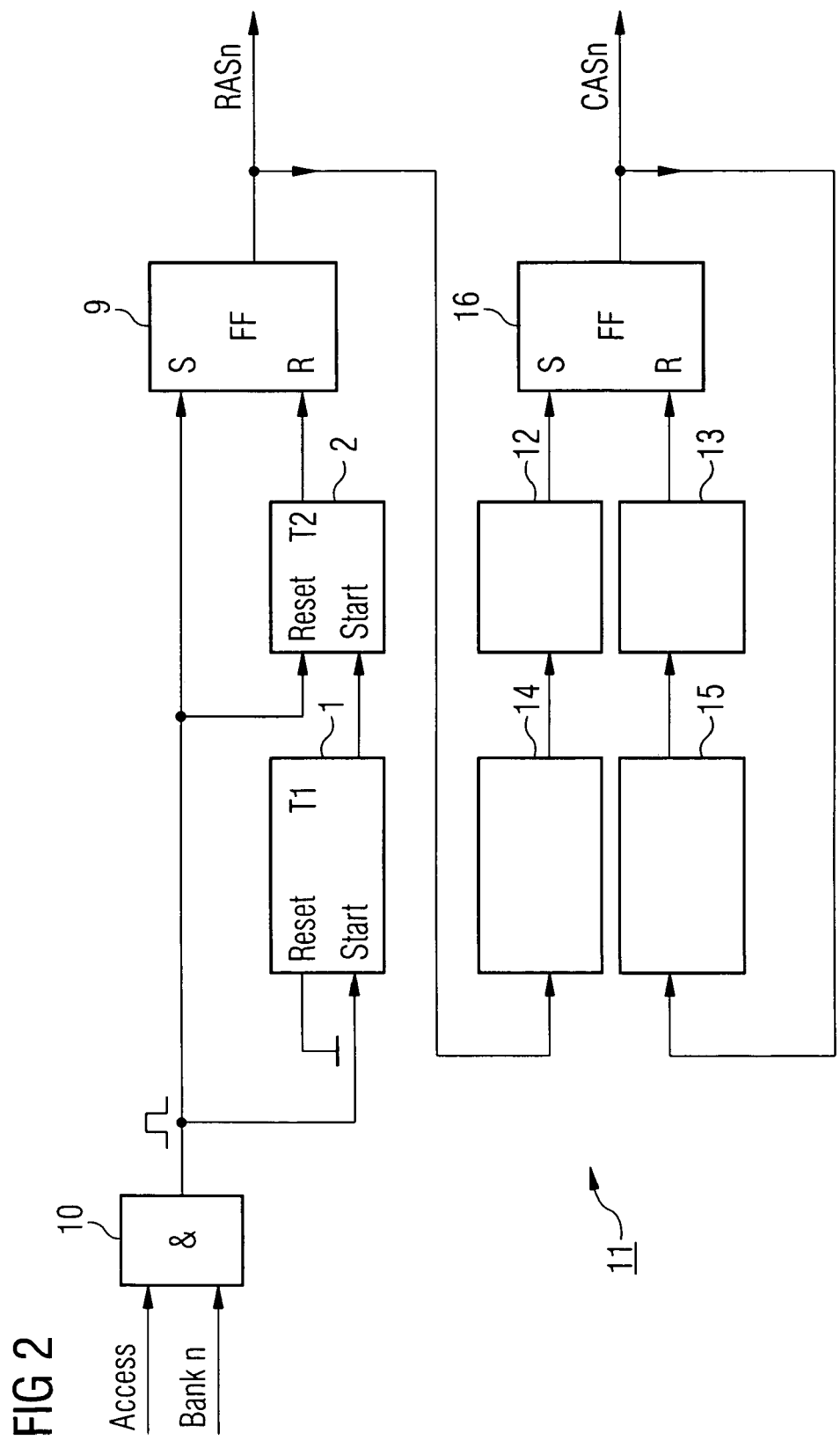
FIG. 2 shows a preferred exemplary embodiment of an apparatus for flexible deactivation of row addresses of a bank of an RLDRAM module.

FIG. 2 shows a detail block circuit of the activation device 11, the activation device 11 having an exemplary embodiment of an apparatus according to the invention for flexible deactivation of row addresses.

The pulsed access signal at the output of the command decoder 4 and the bank selection signal at the output of the bank decoder 5 are logically combined with the aid of a logic gate 10. An output signal of the logic gate 10 is fed to a set input of a first bistable multivibrator 9. In contrast to the activation device 11 in accordance with the prior art, according to the invention, the output signal of the logic gate 10 is additionally fed also to a trigger input of a first delay element 1 and to a reset input of a second delay element 2. The two delay elements, 1, 2 represent in combination a functionality of a monostable multivibrator. The delay time of the monostable multivibrator being composed on the two delay times of the first and second delay elements 1, 2.

In the event of each renewed access to the bank 3, the feeding of the pulsed output signal of the logic gate 10 to the reset input of the second delay element 2 has the effect of resetting a started and elapsing delay time T2 of the second delay element 2. Furthermore, the first delay element 1, having a delay time T1 is started anew by the pulsed output signal of the logic gate 10. The sum of the two delay times T1, T2 of the first and second delay elements 1, 2 produces a defined delay time $t_{RAS}$.

For the case where renewed activations of the already activated bank 3 of the memory module always takes place within the defined delay time $t_{RAS}$, the delay time $t_{RAS}$ being started anew upon each renewed activation by the starting of the first delay element 1 or the resetting of the second delay element 2, what is achieved according to the invention is that the output of the second delay element 2 cannot output a reset signal to the reset input of the first bistable multivibrator 9. As a result, the output signal of the first bistable multivibrator which represents the first activation signal RASn for the row address fed to the bank 3, continues to be active.

According to the invention, the resetting of the first bistable multivibrator 9 is prevented by a renewed access. As a result, it is advantageously possible to feed different column addresses via the addressing device 6 to the same bank 3 with a constant row address. Data can thus be read from memory cells, which are addressed via a word line 17, successively without renewed activation of the word line 17. Consequently, the read-out time is shortened since it is not necessary to activate the word line 17. With an organization of data within the RLDRAM memory module which supports the access method according to the invention, it is thus advantageously possible to access memory cells with a constant row address in significantly shortened time intervals. For this purpose, data which are intended to be read in or out successively are stored in memory cells 18 which are addressed by a word line 17 of a bank 3.

For the case where the already activated bank 3 of the dynamic memory module is not accessed on any further occasion within the defined delay time $t_{RAS}$, the delayable deactivation mechanism according to the invention is not initiated and the first activation signal RASn is deactivated at the output of the first bistable multivibrator 9. This is achieved in that the two delay times T1, T2 of the first and second delay elements 1, 2 respectively, elapse and the second delay element 2 outputs a reset signal at its output to the reset input of the first bistable multivibrator 9. The first activation signal RASn for the row address is connected to a set input of a second bistable multivibrator 16 via a first pulse generator 14 and a third delay element 12. Via the first pulse generator 14 and the third delay element 12, a transition of the first activation signal RASn is transferred in time-delayed fashion to the second bistable multivibrator 16, which provides an activation signal CASn for the column address at its output. In this way, the second activation signal CASn is activated in time-delayed fashion with respect to the first activation signal RASn. In this case, the time delay results from a delay time of the third delay element 12. By means of a feedback of the second activation signal CASn, which is passed via a second pulse generator 15 and a fourth delay element 13 to a reset input of the second bistable multivibrator 16, the second activation signal CASn is deactivated in time-delayed fashion. In this case, the time delay corresponds to a delay time of the fourth delay element 13.

Figure 3:
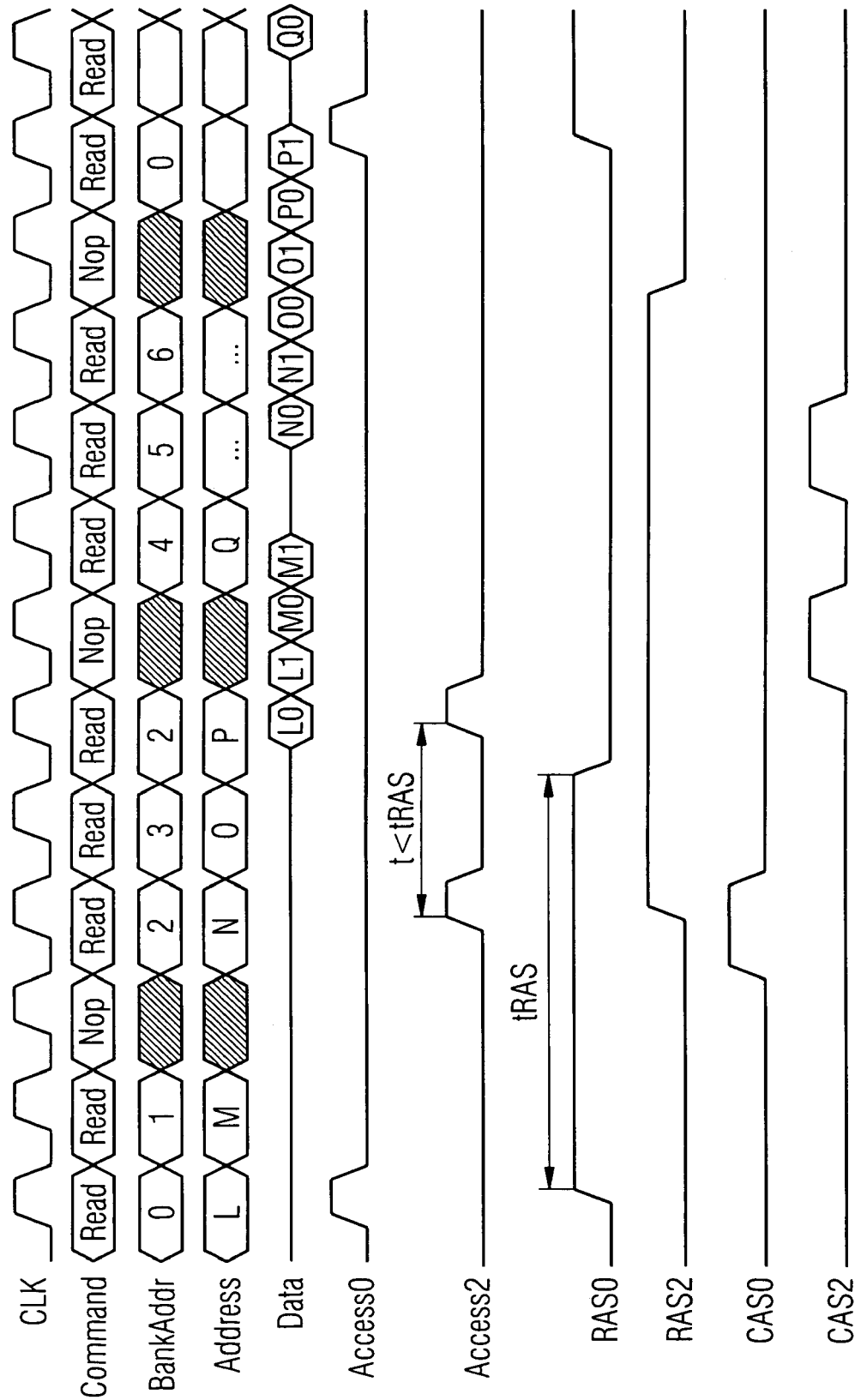
FIG. 3 shows a basic timing diagram which diagrammatically shows a comparison of a conventional access with an exemplary embodiment of an access according to the invention to memory cells of an RLDRAM module.

FIG. 3 shows, in a timing diagram, a comparison of a conventional read access to memory cells of a first bank 0 of the dynamic RLDRAM memory module and also an exemplary embodiment of an access according to the invention to a second bank 2. The diagram reveals, on the basis of the profiles of "BankAddr" and "Access 0", that conventionally a renewed access to the first bank 0 is possible again only after all the other banks of the dynamic memory module have been addressed.

Upon the first access to the first bank 0, an activation signal RAS0 for the row address—corresponding to the access—of the first bank 0 is activated by virtue of the first activation signal RAS0 undergoing transition from an inactive low level to an active high level. The high level of the first activation signal RAS0 is thereupon maintained for the defined delay time $t_{RAS}$ and changes to the inactive low level again after the defined delay time $t_{RAS}$ has elapsed. The activation signal CAS0 for the column address is activated in time-delayed fashion in accordance with the delay time of the third delay element 12 (transition from an inactive low to an active high level) and deactivated again with the delay time of the fourth delay element 13 (transition from the active high to the inactive low level).

Data which are read out for the first time from the first bank 0 by means of the conventional access method are illustrated in a data profile "Data" as L0, L1 in the diagram.

An exemplary embodiment of the invention is illustrated in FIG. 3 in the form of a renewed read access to the second bank 2. It can be seen that the second bank 2 of the dynamic RLDRAM memory module is accessed on a further occasion within a time which is shorter than the defined delay time $t_{RAS}$.

This is evident in the figure from the fact that an activation signal access 2 for the second bank 2 carries out a transition from inactive low to active high on a further occasion within the defined delay time $t_{RAS}$. As a consequence, a deactivation of the activation signal RAS2 for the row address is temporally delayed, so that the activation signal RAS2 for the row address further remains active at the high level. The first access to the second bank 2 is effected with a row/column address N and the further access is effected with a row/column address P. In this case, the addresses N, P have the same row addresses, but in contrast different column addresses. As a result of the two accesses to the second bank 2, data N0, N1 and P0, P1, respectively, are read from the second bank 2 with a shortened time interval.

It can be seen from a comparison between the activation signal RAS0 for the row address of the conventional access method and the activation signal RAS2 for the row address in accordance with the access according to the invention that the activation state of the activation signal RAS2 for the row address persists for longer in accordance with the access according to the invention. As a result, it is advantageously possible to read or write data from or to a specific row of an activated bank in shortened time intervals.

In the case of the present invention, it is regarded as particularly advantageous that it provides downward compatibility with dynamic RLDRAM memory modules. This means that RLDRAMs which have the invention's interconnection of the additional device within the activation device 11 are compatible with conventional RLDRAMs provided that the conventional RLDRAM memory modules are not driven according to the method according to the invention but rather in a conventional manner. Consequently, the dynamic RLDRAM memory module has a conventional operating behavior provided that it is operated in a conventional manner.

However, only those memory systems which have RLDRAMs with the additional device according to the invention and are operated according to the access method according to the invention benefit fully from the present invention in the sense of accelerated memory access.

For the case where, in the context of the present invention, in the event of a further access to an already activated bank, the row address is changed in comparison with the preceding access, an undefined state of the dynamic memory module is established, the operating behavior of which is not defined.

To summarize, it can be stated that, with the aid of the additional device according to the invention, deactivation of row addresses is interrupted for the case where an unchanged row address is accessed in renewed fashion. As a result, it is advantageously possible for data of an already activated row address to be transferred in renewed fashion very much earlier than would be possible in the case of conventional accesses to the dynamic memory module of the RLDRAM type.

It is furthermore regarded as particularly advantageous that the present invention provides an extension of this specified standard for an access mechanism for dynamic RLDRAM memory modules which does not in any way adversely influence the conventional operating mode of the RLDRAM memory modules.

What is claimed is:

1. A reduced latency dynamic random access memory (RLDRAM) module, comprising:
    an activation circuit configured to assert a row activate signal to activate a row accessed by a memory access request received by the module, assert a column activate signal to activate a column accessed by the memory access request, de-assert the row activate signal after a defined activation time duration if the activated row is not accessed again within the defined time duration, and delay de-asserting the row activate signal if the activated row is accessed within the defined activation time duration.

2. The module of claim 1, wherein the activation circuit is further configured to:
    de-assert the column activate signal; and
    if the activated row is accessed within the defined activation time, re-assert the column activate signal prior to de-asserting the row activate signal.

3. The module of claim 1, wherein the activation circuit comprises:
    a logic gate for generating a pulsed signal in response to a bank select signal and an access signal applied to inputs thereof;
    a first bistable multivibrator configured to assert the row activate signal in response to receiving the pulsed output signal generated by the logic gate;
    a first delay element configured to receive the pulsed signal generated by the logic gate at a start input and, in response, generate a first trigger signal a first delay period thereafter; and
    a second delay element configured to receive the first trigger signal at a start input and, in response, generate a reset signal after a second delay period to reset the first multistate vibrator in order to de-assert the row activate signal, unless another pulsed signal generated by the logic gate is received at a reset input of the second delay element prior to expiration of the second delay period.

4. A reduced latency dynamic random access memory (RLDRAM) module, comprising:
    a row address decoder for selecting a row of memory cells within a bank of memory cells based on a row address;
    a column address decoder for selecting a column of memory cells in a row selected by the row address decoder, based on a column address;
    separate busses for applying the row address to the row address decoder and the column address to the column address decoder; and
    an activation circuit configured to assert a row activate signal to activate the row selected by the row address decoder, assert a column activate signal to activate the column selected by the column address decoder, de-assert the row activate signal after a defined activation time duration if the activated row is not accessed again within the defined time duration, and delay de-asserting the row activate signal if the activated row is accessed within the defined time duration.

5. The memory module of claim 4, wherein the activation circuit comprises:

a logic gate for generating a pulsed signal in response to a bank select signal and an access signal applied to inputs thereof;

a first bistable multivibrator configured to assert the row activate signal in response to receiving the pulsed output signal generated by the logic gate;

a first delay element configured to receive the pulsed signal generated by the logic gate at a start input and, in response, generate a first trigger signal a first delay period thereafter; and a second delay element configured to receive the first trigger signal at a start input and, in response, generate a reset signal after a second delay period to reset the first multistate vibrator in order to de-assert the row activate signal, unless another pulsed signal generated by the logic gate is received at a reset input of the second delay element prior to expiration of the second delay period.

6. The memory module of claim 5, wherein the first and second delay periods define the defined activation time duration.

7. The memory module of claim 5, wherein the activation circuit further comprises:

a second bistable multivibrator configured to assert the column activate signal a third time period after the row activate signal is asserted by the first bistable multivibrator.

8. The memory module of claim 7, wherein the activation circuit further comprises:

a first pulse generator configured to generate a pulse in response to the row activate signal asserted by the first bistable multivibrator; and a third delay element configured to receive the pulse generated by the first pulse generator and, in response, generate a set signal after the third delay period to set the second bistable multivibrator to assert the column activate signal.

9. The memory module of claim 8, wherein the activation circuit further comprises:

a second pulse generator configured to generate a pulse in response to the column activate signal asserted by the second bistable multivibrator; and a fourth delay element configured to receive the pulse generated by the second pulse generator and, in response, generate a reset signal after a fourth delay period to reset the second bistable multivibrator to de-assert the column activate signal.

10. A method for accessing of a row of memory cells in a bank of memory cells of a dynamic memory module with random memory cell access, comprising:

applying a row address to a row address decoder to select a row of memory cells and applying a column address to a column address decoder to select a column of memory cells within the selected row;

asserting a row activate signal to activate the row of memory cells selected by the row address decoder;

asserting a column activate signal to activate the column of memory cells selected by the column address decoder;

de-asserting the row activate signal after a defined activation time duration if the activated row is not accessed within the defined activation time duration; and delaying de-assertion of the row activate signal beyond the defined activation time duration if the activated row is accessed within the defined time duration.

11. The method of claim 10, wherein delaying de-assertion of the row activate signal comprises keeping the row activate asserted for at least the defined time duration after the activated row is accessed again.

12. The method of claim 10, comprising asserting the column activate signal to activate different columns of memory cells within the same row of memory cells while the row activate signal is asserted.

13. A method for accessing memory cells of a reduced latency dynamic random access memory (RLDRAM) module, comprising:

receiving a first row address identifying, within a bank of memory cells of the module, a first row of memory cells and a first column address identifying a first column of memory cells within the first row to be accessed;

asserting a first row activate signal to activate the first row of memory cells;

asserting a first column activate signal to activate the first column of memory cells; and prior to de-asserting the first row activate signal:
  again receiving the first row address;
  receiving a second column address identifying a second column of memory cells within the first row to be accessed; and
  asserting a second column activate signal to activate the second column of memory cells.

14. The method of claim 13, further comprising, prior to de-asserting the first row activate signal:

again receiving the first row address;

receiving a third column address identifying a third column of memory cells within the first row to be accessed; and asserting a third column activate signal to activate the second column of memory cells.

15. The method of claim 13, further comprising de-asserting the row activate signal if a defined time period expires without again receiving the first row address.

16. A method for accessing memory cells of a reduced latency dynamic random access memory (RLDRAM) module, comprising:

receiving a first memory access request to access a first row of memory cells in the module;

asserting a row activate signal to activate the first row of memory cells; and prior to de-asserting the row activate signal, allowing multiple columns within the first row to be accessed.

17. The method of claim 16, wherein allowing multiple columns within the first row to be accessed comprises:

asserting a column activate signal to access a first column of memory cells identified with the first memory access request;

de-asserting the column activate signal;

receiving a second memory access request to again access the first row of memory cells in the module; and re-asserting the column activate signal to access a second column of memory cells identified with the second memory access request.

18. The method of claim 16, further comprising receiving the row address of the first row and a column address of the first column on separate buses.

19. The method of claim 16, wherein asserting the row activate signal to activate the first row of memory cells comprises:

asserting the row activate signal for a defined row activation time period after the first memory access request if no subsequent memory access requests to access the first row of memory addresses are received within the defined row activation time period.

20. The method of claim 19, wherein asserting the row activate signal to activate the first row of memory cells further comprises:

delaying de-asserting the row activate signal for the defined row activation time period after subsequent memory access requests to access the first row of memory addresses are received within the defined row activation time period.

* * * * *